(12) United States Patent
Neubauer

(10) Patent No.: US 11,772,409 B2
(45) Date of Patent: Oct. 3, 2023

(54) DIGITAL PEN WITH ENHANCED EDUCATIONAL AND THERAPEUTIC FEEDBACK

(71) Applicant: Lauren Michelle Neubauer, Santa Barbara, CA (US)

(72) Inventor: Lauren Michelle Neubauer, Santa Barbara, CA (US)

( * ) Notice: Subject to any disclaimer, the term of this patent is extended or adjusted under 35 U.S.C. 154(b) by 21 days.

(21) Appl. No.: 17/340,174

(22) Filed: Jun. 7, 2021

(65) Prior Publication Data

US 2021/0291579 A1 Sep. 23, 2021

Related U.S. Application Data

(63) Continuation-in-part of application No. 15/823,426, filed on Nov. 27, 2017, now Pat. No. 11,046,106, which is a continuation of application No. 14/283,825, filed on May 21, 2014, now Pat. No. 9,827,809.

(51) Int. Cl.
| | |
|---|---|
| *G09B 7/00* | (2006.01) |
| *B43K 29/08* | (2006.01) |
| *G09B 5/00* | (2006.01) |
| *G09B 19/00* | (2006.01) |
| *G09B 23/02* | (2006.01) |
| *G09B 11/00* | (2006.01) |
| *G09B 5/06* | (2006.01) |
| *G09B 7/02* | (2006.01) |
| *G09B 19/02* | (2006.01) |
| *B43K 29/10* | (2006.01) |

(52) U.S. Cl.
CPC .............. *B43K 29/08* (2013.01); *B43K 29/10* (2013.01); *G09B 5/00* (2013.01); *G09B 5/06* (2013.01); *G09B 7/02* (2013.01); *G09B 11/00* (2013.01); *G09B 19/00* (2013.01); *G09B 19/025* (2013.01); *G09B 23/02* (2013.01)

(58) Field of Classification Search
CPC .......... G09B 5/00; G09B 11/00; G09B 23/02; G06F 3/03545; B06K 29/08
See application file for complete search history.

(56) References Cited

U.S. PATENT DOCUMENTS

| | | | | |
|---|---|---|---|---|
| 5,546,538 A | * | 8/1996 | Cobbley | .................... G06F 3/16 |
| | | | | 704/E15.04 |
| 8,064,817 B1 | * | 11/2011 | Ziv-El | ...................... G09B 7/00 |
| | | | | 434/350 |
| 2004/0259067 A1 | * | 12/2004 | Cody | .................. G06F 3/03545 |
| | | | | 434/323 |

(Continued)

*Primary Examiner* — Peter R Egloff
(74) *Attorney, Agent, or Firm* — Christopher Lambrecht

(57) ABSTRACT

Disclosed is a digital pen that tracks the user's writing and provides useful feedback based on the user's writing. In one embodiment, the pen may provide feedback when the user has written a misspelled word, invalid mathematical expression, or any noncompliant expression. The pen may also provide feedback relating to the user's handwriting. The feedback may be visual, auditory, or tactile, and may be realtime or delayed. Statistics relating to the user's performance may be tracked, uploaded to external devices, and shared with others. This allows the user and interested parties to track the user's progress over time. The disclosed pen will be useful in educational settings.

3 Claims, 5 Drawing Sheets

(56) References Cited

U.S. PATENT DOCUMENTS

2006/0001667 A1* 1/2006 LaViola ................ G09B 23/02
  345/473
2009/0253107 A1* 10/2009 Marggraff ............. G06F 3/0317
  434/165

* cited by examiner

DIGITAL PEN WITH ENHANCED EDUCATIONAL AND THERAPEUTIC FEEDBACK

BACKGROUND

Digital pens are known in the art. These devices typically look, feel, and operate similar to a normal pen, but include electronics that provide additional functionality. Some digital pens have sensors capable of tracking movement of the pen tip to capture what the user is writing. These pens may be configured to record the user's pen strokes and store a digital version of the user's writing. Educational systems involving handwriting recognition are also known in the art. Information relating to digital pens and educational systems can be found in the following U.S. Patent and Patent Application Publication Numbers, the teachings of which are hereby incorporated by reference: U.S. Pat. No. 6,831,632 to Vardi; 2005/0125228 by Samuels; U.S. Pat. No. 7,120,385 to Marggraff; U.S. Pat. No. 7,175,095 to Pettersson et al.; U.S. Pat. No. 7,853,193 to Margraff; U.S. Pat. No. 8,038,538 to Stucke, Jr. et al.; 2012/0029907 by Loggins et al.; U.S. Pat. No. 8,427,344 to Margraff et al.; and U.S. Pat. No. 8,638,319 to Edgecomb et al.

U.S. Pat. No. 6,831,632 to Vardi discloses a hand-held handwriting recognition device that may perform arithmetic computations based on information received from the handwriting recognition circuitry and display the result. U.S. Pat. No. 8,427,344 to Marggraff et al. discloses a digital pen that may interpret the user's writing and display a spelling correction. While these systems may be useful in certain contexts, they are of limited value in an educational setting.

SUMMARY

One aspect of the disclosure is a digital pen that tracks the user's writing and provides context-appropriate feedback in real time or on a deferred basis. Another aspect of the disclosure is an educational system that provides the ability to track the user's progress over time and modify a scoring regime accordingly to further the user's educational goals. The disclosed pen can enhance educational exercises by providing instantaneous feedback to the user. Providing feedback in real time may enhance the educational utility of the pen by drawing the user's attention to the mistake as soon as it is made, rather than allowing the mistake to go unnoticed and become reinforced by repetition throughout a writing or exercise. In some embodiments, the feedback may alert the user to a mistake without revealing an answer, solution, or other correction. In this way, the pen may be especially useful in educational settings. Additionally, the educational system can provide gains to educators by providing new and more efficient modes of tracking their students' progress. For example, the system may provide educators or mentors with an interface for monitoring the performance of several pupils in real time, so that the educator's attention can be directed to the pupils most in need of assistance.

One aspect of the disclosure provides a writing device. The writing device may include a tip capable of writing on a surface and a sensor capable of capturing a representation of the writing. The device may also include a processor coupled to the sensor that is capable of generating compliance data based on the representation of the writing and one or more rules. Additionally, the writing device may include an output device coupled to the processor. The output device may be capable of generating feedback based on the compliance data. Furthermore, the writing device may include a memory coupled to the processor. The memory device may be capable of storing at least a portion of the compliance data.

Another aspect of the disclosure provides a method of providing educational feedback. The method may comprise the step of creating a writing on a surface with a tip, and capturing a representation of the writing with a sensor. The method may further include the step of generating compliance data based on the representation of the writing and one or more rules. The method may further include the step of generating feedback based on the compliance data using an output device. Additionally, the method may include the step of storing at least a portion of the compliance data in a memory.

Yet another aspect of the disclosure provides an educational system. The system may include a communication device that receives compliance data from one or more handheld writing devices. The system may also include a display device that displays information related to the received compliance data. The compliance data may be generated by a processor based on one or more rules and a representation of a writing captured by a sensor coupled to each of the one or more writing devices.

DETAILED DESCRIPTION

Disclosed is an educational system that includes a digital pen capable of tracking the user's writing, determining whether the writing complies with one or more rules, and providing feedback relating to the user's performance with respect to one or more goals. By way of example, The pen may be used to track the user's performance in spelling, grammar, handwriting, mathematics, and other domains or activities. In some embodiments, the feedback may alert the user to a mistake without revealing an answer, solution, or other correction. In this way, the pen may be especially useful in educational settings. The system may be updated with new sets of rules pertaining to a variety of domains and/or activities. The feedback may be real time or delayed. The system may also include an interface for tracking feedback from a multiple devices. The interface may allow a person, such as a teacher in a classroom, to monitor feedback from two or more pens simultaneously and in real time.

Figure 1:
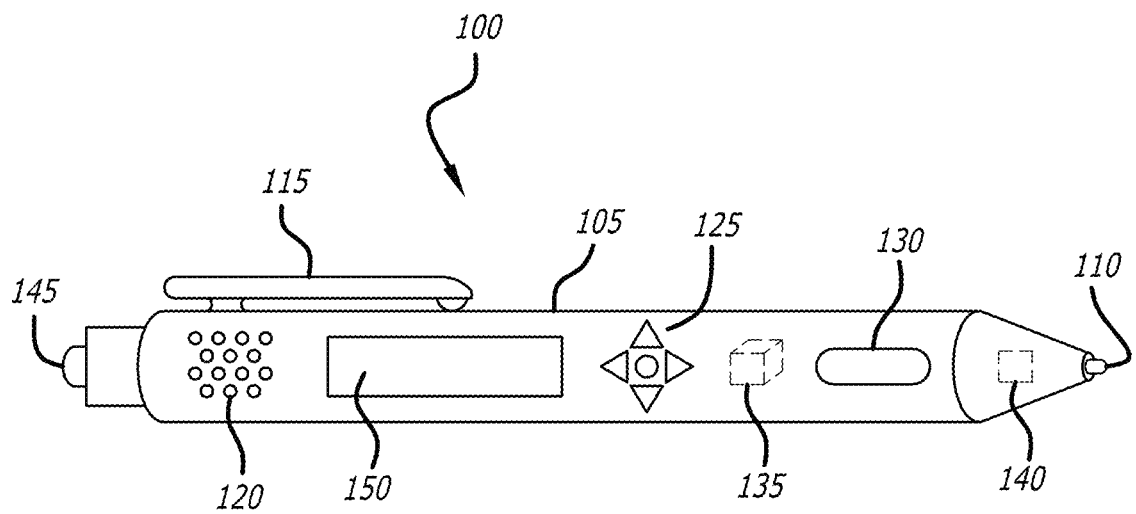
FIG. 1 is a view of an exemplary writing device in accordance with the disclosure.

Referring to the drawings more particularly by reference numbers, FIG. 1 shows an exemplary pen 100 in accordance with the disclosure. The pen 100 may include a handheld housing 105 composed of metal, plastic, glass, or other suitable material. At one end the housing may include a tip 110 capable of writing on a surface. The tip 110 may be a fountain tip, ball-point tip, felt tip, or any other applicator designed to apply a liquid ink to a surface. Alternatively, the tip 110 could be designed to apply other substances, such as graphite or wax, as with a pencil or crayon. The housing 105 may also include a clip 115 for anchoring the pen 100 to a clipboard or a piece of clothing such as the breast pocket of a shirt or jacket. The housing 105 may further include one or more open or vented sections 120. The vented section 120 may facilitate the passage of acoustic energy through the housing of the pen to and from a microphone or speaker, or both, contained within the housing 105. The microphone and/or speaker (not shown) may be used for general recording and playback of audio information. The microphone may also be used for receiving voice commands for controlling the pen 100.

The pen 100 may also include a number of input and output devices for interfacing with the user. For example, the pen 100 may include input devices such as buttons 125, pressure sensors 130, and microphones (not shown). The pen 100 may also include one or more sensors for receiving gestural inputs or input in the form of writing. For example, the pen 100 may include one or more accelerometers or other motion sensors 135 for tracking the orientation and movement of the pen 100 in space. The pen 100 may include a first motion sensors or set of motion sensors for capturing gestural input or general movement of the pen and a second motion sensor or set of motion sensors for capturing writing created with the pen tip. Alternatively, the pen may employ one more motion sensor or set of motion sensors to capture both types of input. Although the one or more motion sensors 135 are illustrated as being near the midpoint of the housing 105, in other implementations, the motion sensors 135 may be disposed further towards either or both ends of the housing 105. The pen 100 may also include one or more cameras or other optical sensors 140 for tracking the movement of the pen tip 110 with respect to a surface. The optical sensor 140 may be a camera or other image sensor disposed near the tip of the pen that has a view of the writing surface when the tip is engaged with the writing surface. The writing surface may bear naturally occurring surface features whose movement can be tracked by the optical sensor. Alternatively, the writing surface may bear an artificially created pattern that allows the system to track the position of the tip with respect to the writing surface. An example of such a surface is described in U.S. Pat. No. 7,175,095, incorporated by reference herein.

Alternatively, or additionally, the motion of the pen may be tracked using one or more accelerometers or other motion sensors. An example of such a system is described in U.S. Pat. No. 6,831,632, incorporated by reference herein. By way of example, the pen may include as many as three or more independent accelerometers, each arranged to measure motion along a different spatial axis. The pen may employ both optical and motion sensors and intelligently fuse the output of both sets of sensors to improve the reliability of the handwriting detection and extend the overall functionality of the pen. The pen may treat motion detected by an accelerometer differently when it is accompanied by motion of the writing surface detected by the optical sensor. For example, the pen may disregard motion detected by an accelerometer when not accompanied by motion of the writing surface detected by an optical sensor. Alternatively, the pen may treat such detected motion as an input for changing the operational mode of the pen rather than a writing to be stored or interpreted by the processor. For example, shaking the pen, i.e., moving the pen rapidly back and forth or side-to-side, away from a writing surface may toggle the device power, an audio recording function, a handwriting recognition and recording function, or other functions. However, moving the pen back and forth while the tip is engaged with a writing surface may be treated as a gesture of striking out text, and may cause a recent unit of writing to be disregarded by the pen's performance tracking algorithm, or deleted from the pen's handwriting detection and recording function. Detecting the presence of a writing surface under the pen tip could alternatively or additionally be accomplished using a sensor that measures pressure on, or deflection of, the pen tip.

The pen 100 may additionally include one or more pressure sensors 130 disposed in, on, or around housing 105. The one or more pressure sensors 130 may be used to detect whether and how the user is gripping the pen. For example, the pen may be configured to transition to an active state when sensors 130 indicate that the pen is being gripped or held. Additionally, the pen 100 may disregard or treat differently movement of the pen detected when the sensors 130 do not indicate that a user is gripping the pen in a usual manner. Additionally, the pen 100 could be configured to provide feedback to the user when values from the sensors 130 indicate that the pen 100 is being held inconsistently with a desired force/pressure profile. For example, the pen 100 may beep, vibrate, or illuminate an LED if the user is gripping the pen 100 to firmly or too softly, or too far from or too close to the tip 110. A multicolored LED may be used to display a range of colors to indicate how severely the user's current grip deviates from the desired force profile.

The pen 100 may additionally include a number of output devices for providing feedback and other information to the user. These may include light sources, such as one or more LEDs 145, audio sources, such as speakers or buzzers (not shown), and tactile feedback sources, such as electromechanical oscillators that produce vibration (not shown). The one or more LEDs 145 may be multicolored to communicate feedback of different types and/or degrees. Although FIG. 1 illustrates that the one or more LEDs 145 are disposed at one end of the pen 100, it is to be understood that the one or more LEDs 145 may be disposed at either end of the pen 100, and/or anywhere in between. For example, it may be advantageous to position one or more LEDs 145 near the tip 110 or near where the pen is typically gripped to facilitate being seen by the user. The pen 100 may also include a display screen 150 for displaying various information to the user, such as characters, words, or graphics, to provide feedback or indicate a current mode of the pen. For example, if the pen were set to monitor and provide feedback regarding the user's spelling, the display screen 150 may display the word "spelling" or the letters "ABC". Additionally, display screen 150 may display various menu options. The user may navigate through these menu options using buttons 125. Exemplary display screens 150 could include LED, LCD, or any other visual display devices capable of displaying characters, symbols, words, or graphics. The various output devices allow the pen 100 to provide feedback to the user as well as communicate various information to the user regarding the state of the pen 100 and other operational parameters.

Figure 2:
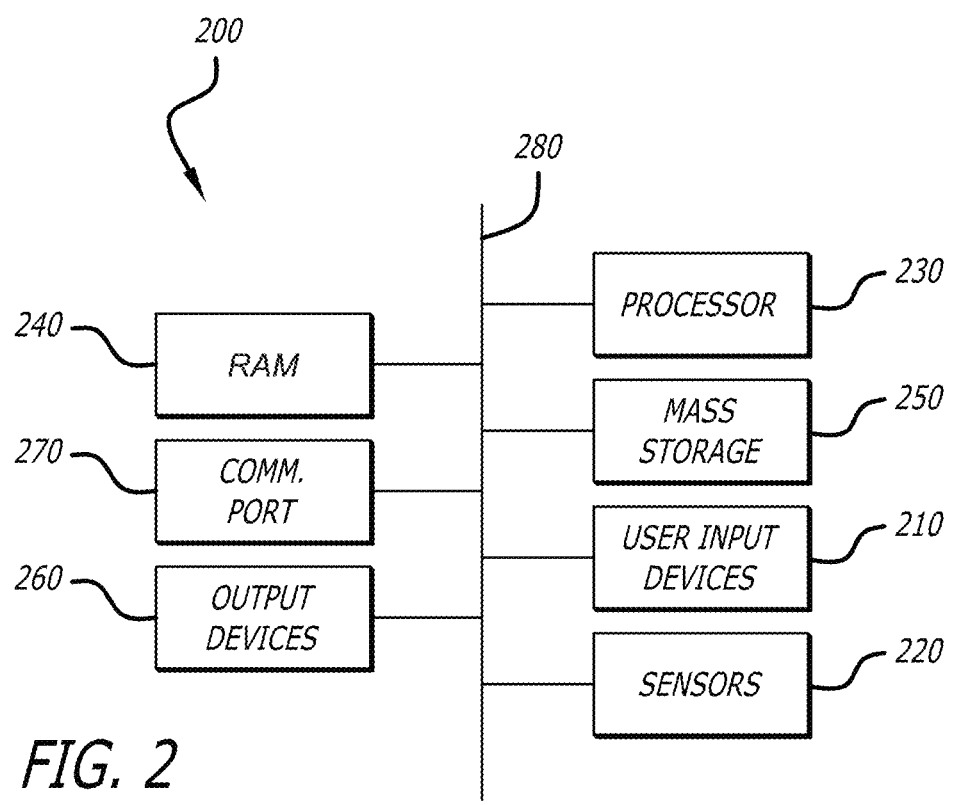
FIG. 2 is a block diagram of the functional components of an exemplary writing device.

FIG. 2 is a block diagram illustrating various functional components of an exemplary hardware configuration 200 of a pen in accordance with the disclosure. The various components may communicate with each other via one or more buses 280. The pen may include one or more batteries (not shown) or other power supply for powering the various electronic components of the pen. The battery may be replaceable or rechargeable, or both. The pen may be configured to be wirelessly rechargeable. The pen may also be powered by a wired or wireless connection to an external power supply.

As discussed above with respect to FIG. 1, the pen may include a number of user input devices 210 such as buttons, switches, pressure sensors, etc., that allow the user to activate, deactivate, or otherwise change the operational mode of the pen. The pen may also include sensors 220 for capturing a representation of the user's writing and other movements of the pen. The sensors 220 may include one or more optical sensors, accelerometers, gyroscopes, magnetometers, or other devices capable of detecting or measuring movement or motion.

The various sensors 220 and user input devices 210 may be coupled to a processor 230. The processor may execute application software as discussed in greater detail below. The application software may be stored on a non-transitory computer-readable medium, such as a random access memory (RAM) 240, a mass storage device 250, a ROM, a FLASH memory, an EEPROM, or any other suitable memory or storage device on the pen or an external device in communication with the pen. The processor 230 may be physically attached to or incorporated within the housing of the pen, or may be disposed in an external device in communication with the pen. In one exemplary mode of operation, the processor 230 may receive a representation of the user's writing in the form of signals output from sensors 220. The processor 230 may perform handwriting recognition on the output of the sensors 220. Once the handwriting recognition has been performed, the processor 230 may parse the recognized handwriting using language processing algorithms to assemble individual alphanumeric characters, symbols, punctuation marks, and mathematical symbols into words, phrases, sentences, paragraphs, and other grammatical units. For example, the processor 230 may recognize a sequence of letters as an English word, such as "cat". Similarly, the processor 230 may recognize a sequence of numbers interspersed with arithmetic operators as a mathematical expression. For example, the system may identify "2" followed by "+" and "2" and "=" as a mathematical expression.

Depending on the operational mode of the pen, the processor 230 may generate compliance data by applying one or more rules to the recognized writing. The rules may pertain to spelling or grammar in a particular language, mathematics, handwriting, or other domains. For example, the compliance data may specify whether a word has been misspelled, a grammar rule violated, a letter formed in a manner inconsistent with handwriting conventions, or whether an identified mathematical expression is invalid. The processor 230 may monitor the writing for compliance with rules in multiple domains at once, or only a single domain. The specific domain or domains for which the processor 230 monitors compliance may be specified by user input provided via the pen or an external device in communication with the pen. Alternatively, the domain or domains may be specified automatically as part of an educational program or algorithm.

The processor 230 may store all or a portion of the compliance data in a memory, such as a random access memory (RAM) 240. The contents of the RAM 240 may be transferred to a mass storage device 250. The processor 230 may also calculate statistics related to the stored compliance data. These statistics may also be stored in the RAM 240, storage device 250, or communicated to an external device in communication with the pen via a communication port 270.

The processor 230 may additionally be configured to store the representation of the writing and any recognized text in mass storage device 250. The mass storage device may be coupled to the housing of the pen, or may be disposed in an external device that can communicate with the pen. The mass storage device 250 could additionally or alternatively take the form of a removable thumb drive that mates with a communication port 270 of the pen. The contents of the mass storage device 250 may be transferred or synced automatically with an external device. It is to be understood that the functions accomplished by the RAM 240 and the mass storage device 250 depicted in FIG. 2 could alternatively be performed by a single memory device.

The pen may include various output devices 260 coupled to the processor 230 for providing feedback to the user. In one embodiment, when the processor 230 determines that the user has written a misspelled a word, the processor may illuminate an LED to alert the user to the misspelling. In another embodiment, the processor 230 may activate an electromechanical oscillator to cause the pen to vibrate. In yet another embodiment, the processor 230 may cause a speaker on the pen to play an audible tone or sound.

The pen may also include a communication port 260. The communication port may support wired communication protocols, wireless communication protocols, or both. Exemplary wired communication protocols could include USB or HDMI. Exemplary wireless communication protocols could employ Wi-Fi, such as any of the IEEE 802.11 standards, BLUETOOTH, or cellular protocols.

Figure 3A:
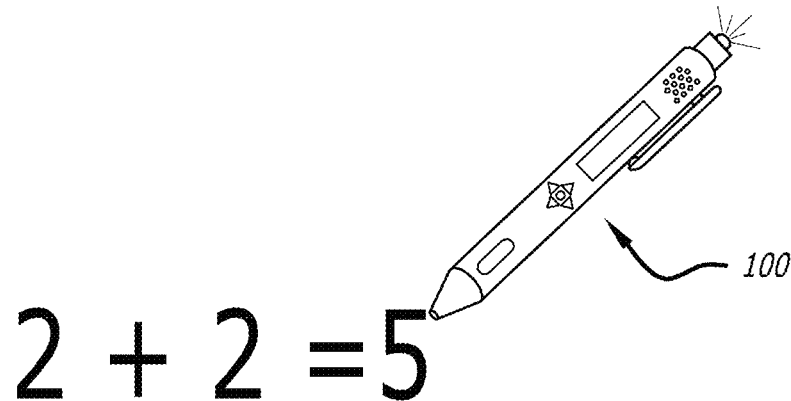
FIG. 3A illustrates an exemplary writing device used in the context of a math problem.
Figure 3B:
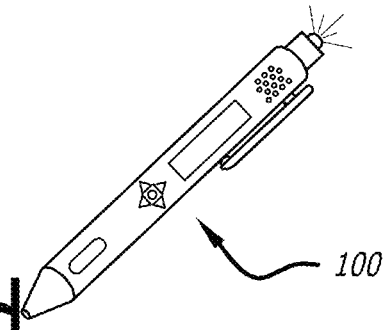
FIG. 3B illustrates an exemplary writing device used in a spelling context.

FIG. 3A illustrates an example of the pen 100 being used in an arithmetic mode. When the user writes "2+2=5", the processor recognizes the writing as a mathematical expression. The processor subsequently applies arithmetic rules to the expression and determines the expression to be invalid. Accordingly, the processor may activate an output device such as a red LED to alert the user to the invalid expression. Additionally, the processor may activate a green LED had the user written a valid expression, such as "2+2=4". FIG. 3B illustrates an example of the pen 100 being used in a spelling mode. Here, the processor identifies "rid" as a misspelling. In some cases, the pen 100 may simply identify misspellings by searching a dictionary of the relevant language for an identified word and determining whether the identified word is present in the dictionary. However, in some cases, as illustrated in FIG. 3B, a word such as "rid" may be found in the English dictionary, even though it is a misspelling in context. Thus, in some embodiments, the pen 100 may also apply more sophisticated rules to surrounding words, phrases, or sentences to determine whether any of the rules is violated. For example, the pen 100 may function in a mode in which the user is asked to write sentences about a predefined scene or situation, such as a picture or verbal description of a scene including a red ball. The processor may recognize the text "The ball is" as introducing an attribute of the ball. Thus, if "rid" is not found in a list of attributes associated with the ball (e.g., red, round, etc.), the pen 100 may illuminate an LED to indicate this noncompliance to the user.

Figure 3C:
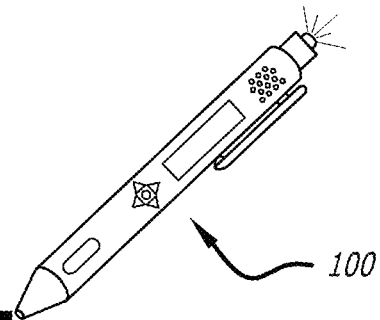
FIG. 3C illustrates an exemplary writing device used in handwriting context.

FIG. 3C illustrates an example of the pen 100 being used in a handwriting mode. The pen 100 may maintain a set of rules relating to guidelines for forming the letters of the alphabet and other alphanumeric symbols. If the pen 100 identifies either an unrecognized character or a recognizable character that was formed improperly, it may provide feedback to alert the user to the noncompliance.

Figures 4, 5:
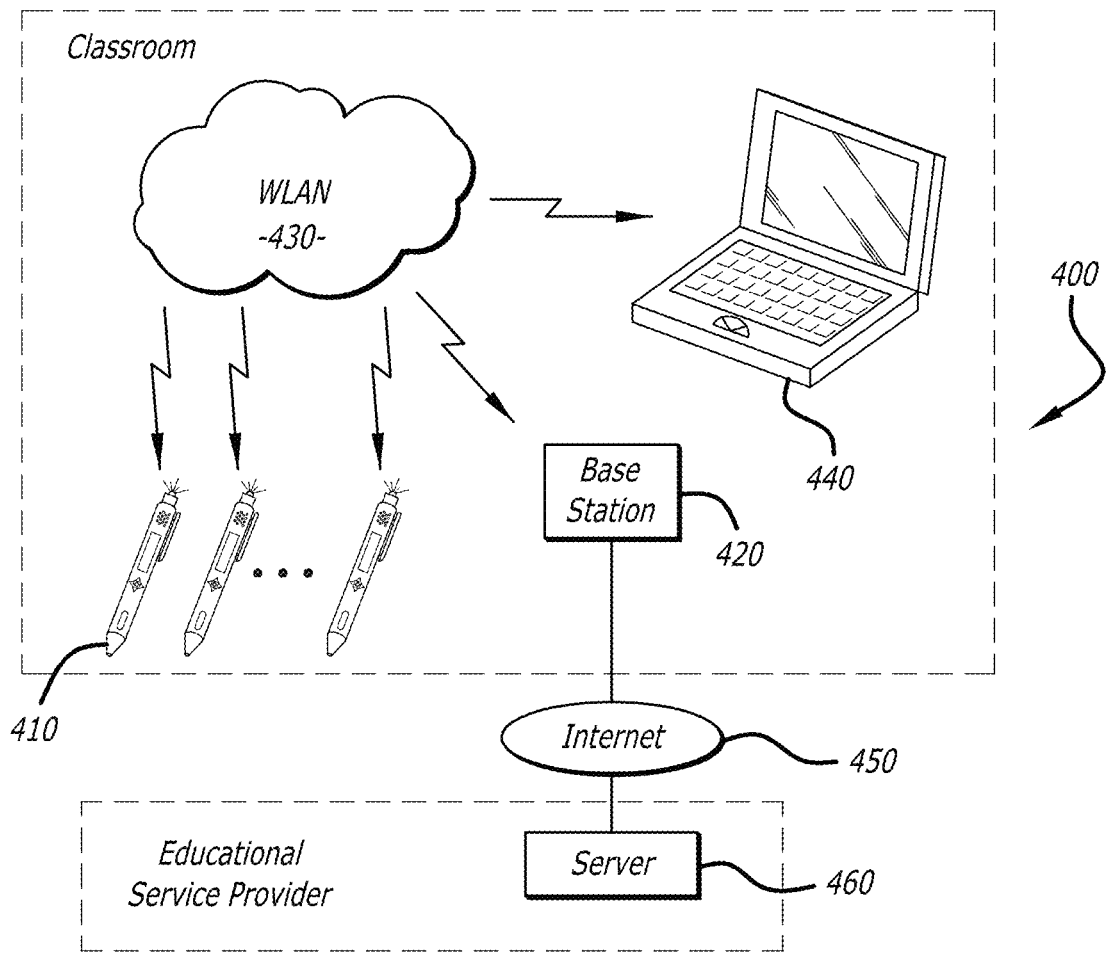
FIG. 4 illustrates an educational system in accordance with the disclosure.
FIG. 5 is a view of a user interface displayed in an exemplary educational system.

FIG. 4 illustrates an educational system 400. The system 400 may include one or more pens 410 such as the pen 100 shown in FIG. 1 and describe above. The system may be set up in a classroom and may also include a base station 420 or wireless access point that forms part of a wireless local area network (WLAN) 430 that allows communication between the pens 410 and an external computing device 440, such as a laptop, desktop, tablet, or smartphone. One or more of the pens 410, the access point 420, or the external computing device 440 may be coupled to the Internet 450 or other communication network to allow communication with a remote server 460. The remote server may be operated by a school, educational service provider, or other organization. In one example, as one or more students in the class room use their pens 410, the pens 410 may wirelessly communicate the associated compliance data and other information to the external computing device 440. Although external computing device 440 is shown inside a classroom in FIG. 4, it is to be understood that the external computing device 440 could be located outside the classroom as well. In general, external computing device 440 can be located anywhere a connection to the Internet 450 is available.

The server may include a web application or interface that can be displayed by a web browser running on an external computing device 440. The web interface may enable any or all of the functionalities described throughout disclosure with respect to the external computer device 440. Additionally, or alternatively, the external computing device 440 may execute its own software application that provides any or all of these functionalities.

A user of the external computing device 440, such as a teacher in a classroom or an administrator at the educational service provider, may use an interface of the external computing device 440 to define a group of pens. The group of pens may be a subset of all the pens with which the external computing device 440 or the remote server 460 can communicate. The group of pens may include pens in disparate geographical locations, such as different classrooms or different schools. Additionally, for example, the group may include individual pens associated with students in arbitrary locations that are participating in an online course. In one embodiment, the user may use external computing device to configure the group of pens in a specific mode, or for a specific assignment or exercise. For example, the user may configure the group of pens for a spelling test. In this example, the group of pens may be set to monitor and provide feedback regarding spelling for a specific period of time, or until a specified number of words have been written, or a specified number of correctly or incorrectly spelled words have been written. Similar tests could be defined for math, handwriting, and other domains. At the conclusion of the test, the pens may transmit scores or compliance data to the remote server 460 or the external computing device 440. In one example, the compliance data received from the pen may be transmitted to the remote server 460, which may subsequently transmit the received information to the external computer device 440. Alternatively, the remote server 460 may transmit to the external computing device 440 only scores or other derivative information based on the information the remote server 460 receives from the pens.

Additionally, the pens may communicate the entirety of the captured writing to the external device 440 or the server 460. This may eliminate the need for students to hand in a hard copy of a given assignment or exercise. Handwriting verification may be employed to verify that the handwriting captured by a particular pen matches a handwriting profile of the user ID associated with the pen during the assignment. The information from the pens may be communicated on a real-time or deferred basis. For example, the information may be transmitted continuously, upon completion of a predefined exercise or assignment, upon expiration of a predefined time interval, at a specific time, upon input to the pen by the student, or in response to a request initiated by the external computing device 440. For example, the external computing device may request information from registered pens periodically, at a specific time or upon a specific event, such as opening or closing of an application on the external device, or upon input from the teacher or other user via the interface.

In one example, one or more pens 410 may be networked together to permit a group of people to engage in a timed exercise or competition. The pens 410 may communicate with each other, an external computing device 440, or a server 460 to determine which user achieved a highest score for the competition. At the conclusion of the competition, the winning user may receive positive feedback from his or her pen, and other users may receive negative feedback from their pens. Additionally, or alternatively, the pens 410 may provide real time feedback during the competition to indicate to each user their current rank in the competition. For example, the pens 410 may illuminate a green LED if the user is currently leading in the competition, and a red LED if the user is currently trailing in the competition. The pens 410 may blink the LEDs with increasing or decreasing frequency as the user's lead or deficit increases or decreases during the competition. Users may also use the system 400 to participate in asynchronous competitions, in which each user's input is received at different times and individual scores or competition results are displayed on a webpage or other interface available via an external device 440.

FIG. 5 illustrates an exemplary screen 500 of a graphical user interface that may be displayed on an external computing device. In one example, the interface may be used by a teacher in the classroom to monitor the performance of one or more students using a pen in accordance with the disclosure. In one embodiment, the interface may include an area 510 that displays an identifier associated with each pen registered with the interface. The user may select a particular ID to display further information associated with the selected ID as discussed further with respect to FIG. 6. The interface may also include an area 520 that displays a score or metric associated with the compliance data received from each pen. The external computing device may receive compliance data from the pens and calculate the score or metric itself. Alternatively, the score or metric may be computed at the pen or other device, such as a remote server, and communicated to the external computing device for display on the interface. The interface may also display other information, such as an indication of the user's current activity level or category, the operational mode of the pen, device status, or other information. The interface may be configured to highlight, color-code, or otherwise display a call out 530 to individual scores depending on whether they exceed or fall below a specified threshold, or otherwise fall within various ranges. Additionally, the interface may be configured to automatically sort the list of scores from highest to lowest, or lowest to highest, so that a teacher or instructor may be made aware of students that are performing especially well or poorly. The sort order may be updated in real time if one or more of the pens are active. Alternatively, the screen may display or highlight the name of a user who has made several mistakes in succession or within a particular time window. The time window may be adjustable via the interface. In another example, a parent may use the interface on their smartphone to remotely monitor the progress of a child as he or she completes a homework assignment or practices a particular activity. In another example, in addition to tracking compliance, the interface may compute statistics pertaining to how long each student takes to complete each individual problem. For example, the list may highlight students taking especially an especially long or short period of time to complete correct mathematical expressions, such as "2+2=4".

Figure 6:
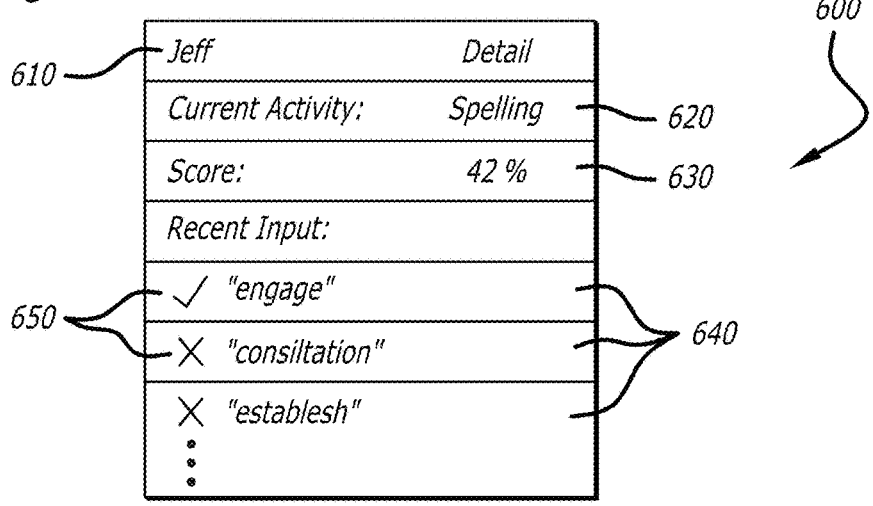
FIG. 6 illustrates another view of an exemplary user interface in accordance with the disclosure.

FIG. 6 illustrates another exemplary screen 600 that may be displayed by a graphical user interface in accordance with the disclosure. The screen may be displayed by selecting a particular ID listed on the screen 500 displayed in FIG. 5. The screen 600 may include areas for displaying a variety of information, including the selected ID 610, the current or most recent activity for which the pen was used 620, a score or other metric 630 related to compliance data generated by the pen, recent writings 640 or other input recorded by the pen, and/or information relating to the compliance of individual inputs recorded by the pen. The screen 600 may display an indication 650 of whether recent input complies with one or more compliance rules. Although symbols 650 are illustrated as the letter "x" and a check mark in FIG. 6, the screen 600 could employ alternate ways of indicating compliance of individual inputs, such as by varying fonts color, size, or type face, background color, highlighting, or using animation. The screen 600 may also include various selectable features for refreshing the data received from the pen, requesting additional data from the pen, sending a message to the pen, configuring the pen, and/or displaying one or more stored representations of writing recorded by the pen. In an another embodiment, the user may swipe or select an icon on screen 600 to display a full-page rendering of the captured writing received from a particular pen or ID. In this embodiment the, the interface may underline, highlight, or otherwise visually call out portions of text that violate compliance rules, as well as display numerical scores or statistics related the captured writing. The pen may have a specified input, such as a button or verbal command or gesture that signals the beginning of a new page. Alternatively, the user's writing may be recorded on a continuous document, such as a scroll. The interface displayed on the external device may allow the user to page or scroll through the recorded writing. The screen 600 may also be configured to display a list of domains or activities and a score or metric indicating the user's performance in each domain or activity. This may be useful for quickly identifying the user's strengths and weaknesses.

Figure 7:
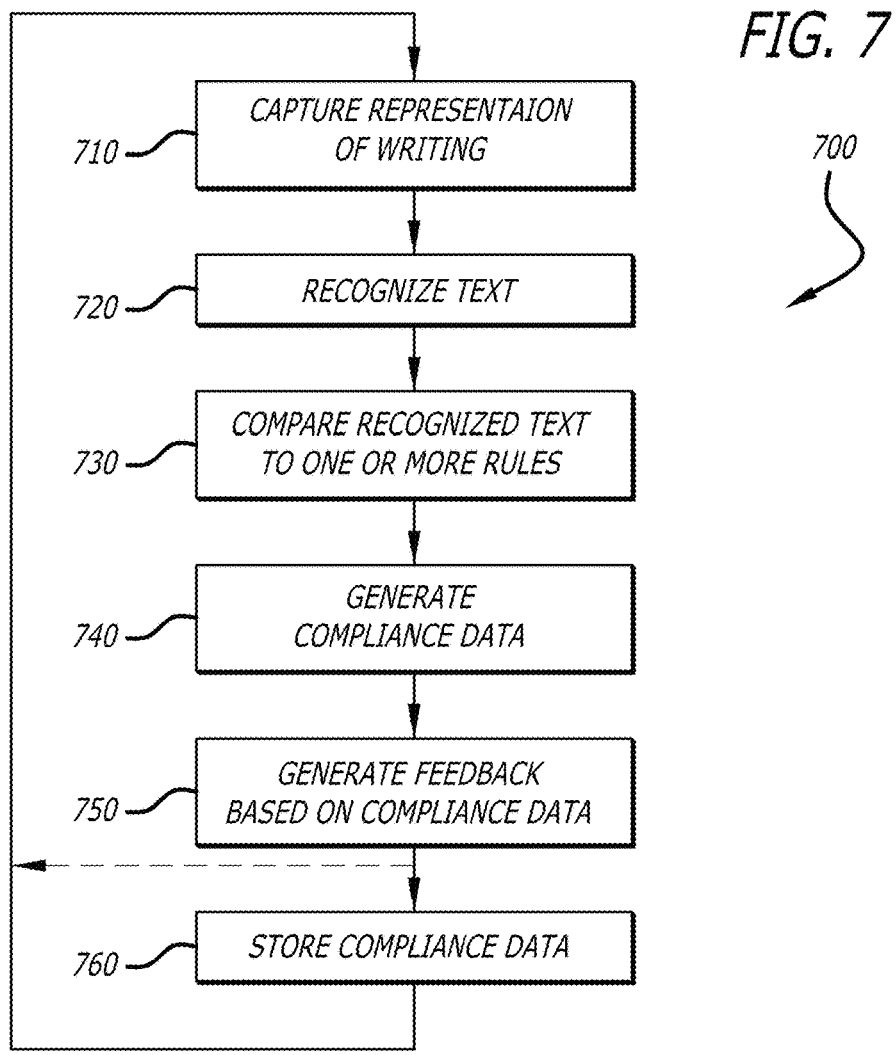
FIG. 7 is a flow chart illustrating an exemplary process of a writing device in accordance with the disclosure.

FIG. 7 is a flowchart illustrating an exemplary process 700 carried out by the pen. The process 700 may be executed by a processor on the pen or on an external device. Alternatively, execution of the process 700 may be divided across a processor of the pen and a processor of an external device. At step 710, as the pen is used to write on a surface, one or more sensors capture a representation of the writing by detecting the movement of the pen. At step 720, the processor analyzes the representation of the writing using handwriting recognition algorithms. The output of the handwriting recognition step is a sequence of alphanumeric characters, symbols, punctuation marks, etc. The processor analyzes the recognized characters and symbols using language and grammar processing algorithms to identify individual letters and symbols as well as assemble words, phrases, sentences, paragraphs, equations, and other units of grammar.

As the processor decomposes the representation of the writing into grammatical units, at step 730 the processor applies one or more rules to each grammatical unit. For example, if the pen is set in a spelling mode, the processor will verify whether a word written with the pen exists in a dictionary or otherwise fits its context, as discussed above with respect to FIG. 3B. At step 740, the processor generates compliance data. For example, in the spelling example, if a particular written word does not appear in the dictionary, the processor will generate negative compliance data, indicating that no match was found. At this point, in step 750, the processor may generate feedback to alert the user of the unrecognized word by illuminating an LED on the pen, playing a sound, or causing the pen to vibrate. At 760, the processor may store all or a subset of the compliance data generated in step 730. For example, the pen may store only negative compliance data, i.e., data regarding non-compliant writings. Although the above steps are described as being performed in a specific sequence, it is contemplated that some steps could be performed in another order or performed in parallel.

The user may activate or deactivate the above-described process by providing input to the pen or an external device in communication with the pen. The input could include manipulating a button or switch, speaking an audible command that can be detected by a microphone, or performing a specific gesture, such as shaking the pen or tapping the pen on a surface. Because the pen may have more than one user, before the above-described process begins, or as part of the above-described process, the user may be required to provide a user ID, so that the captured representation of the writing, compliance data, performance statistics, and other information generated or recorded while the pen is in use may be associated with a particular user. The user may provide their ID via an external device in communication with the pen, or by writing their ID, a PIN, or both, on a writing surface, or by using buttons or other input devices on the pen to select an appropriate ID from a list of IDs stored in the pen, and in some cases subsequently provide a PIN to verify their identity. The user could alternatively speak their ID and/or PIN into a microphone of the pen, or voice recognition software could be used to analyze the user's voice and match a specific ID associated with the user's voice. Alternatively, the pen could include a thumbprint or other biometric scanner that could be used to identify the user. In another embodiment, the pen may store handwriting profiles for multiple users and employ handwriting recognition software to identify the current user after the user begins writing.

Figure 8:
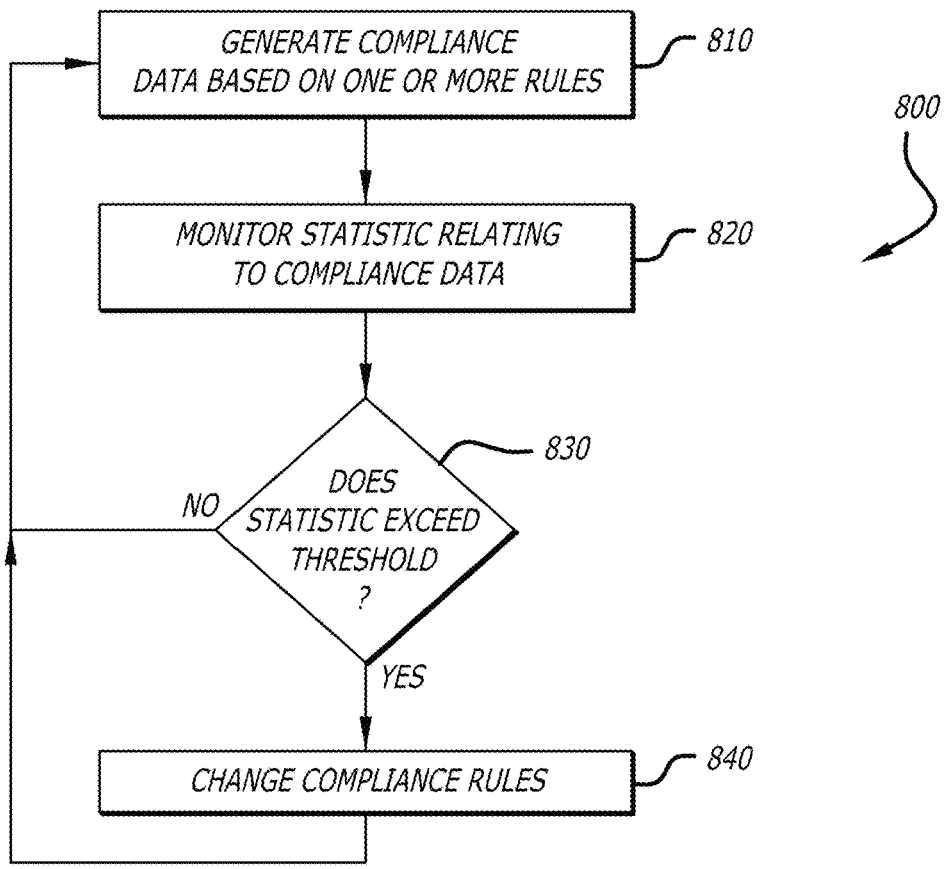
FIG. 8 is a flow chart illustrating another exemplary process of a writing device in accordance with the disclosure.

FIG. 8 is a flow chart illustrating another exemplary process 800 carried out with a writing device in accordance with the disclosure. The process 800 may be executed by a processor on the pen or on an external device. Alternatively, execution of the process 800 may be divided across a processor of the pen and a processor of an external device. The process functions to modify the pen's behavior as the user's performance progresses or regresses. At step 810, as the pen is used, compliance data is generated based on one or more rules as described above. At step 820, the processor monitors one or more statistics relating to the compliance data. At step 830, if the processor determines that the statistic does not exceed a specified threshold, then the process returns to step 810. If, however, at step 830 the processor determines that the statistic does exceed the specified threshold, the processor may at step 840 update or change the one or more rules used in generating the compliance data before the process returns to step 810. In this way, the pen or external device may modify its behavior as the user's performance changes over time. By way of example, if the user were a young child learning handwriting, the pen may not provide real-time feedback for misspelled words, but rather only improperly formed characters, e.g., a backwards "e" or "j", etc. However, as the user's handwriting performance improves, and fewer handwriting mistakes are made, the pen may begin to generate feedback for misspelled words. Additionally, as the user's spelling performance advances, the pen may begin to generate feedback based on more advanced rules regarding grammar, punctuation, style, etc. Alternatively, rather than changing or updating compliance rules, the processor may produce compliance data using all available rules and simply update one or more feedback rules that govern when, how often, and what type of feedback is generated.

Figure 9:
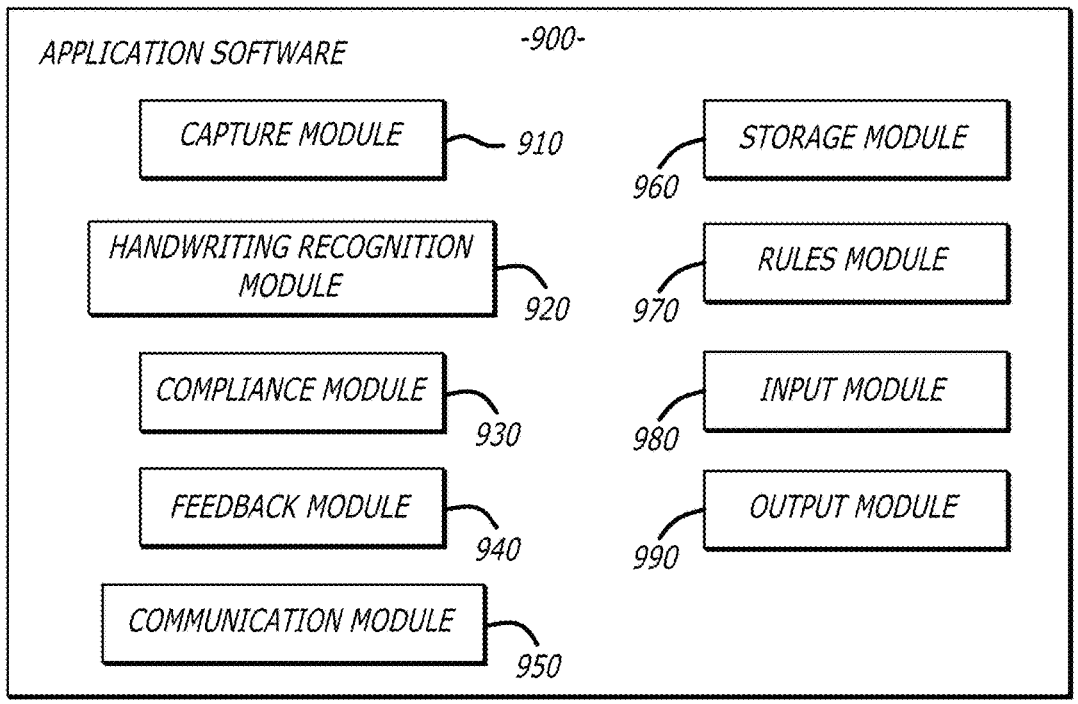
FIG. 9 is a block diagram of an exemplary software application in accordance with the disclosure.

FIG. 9 is a block diagram of a software application 900 in accordance with the disclosure. The application 900 may be stored on a non-transitory computer-readable medium. The medium may be disposed on the pen or an external device in communication with the pen, or both. The medium may be a random access memory (RAM), read-only memory (ROM), mass storage device, FLASH memory, EEPROM, or any other suitable memory device. The application 900 may include a number of functional modules that implement the various features and functionalities of the pen. The application 900 and its various modules may execute on a processor on the pen or on an external device in communication with the pen, or both. The application 900 may include a capture module 910 that takes in data from the one or more sensors on the pen used to capture a representation of the user's writing. Handwriting recognition module 920 may receive the representation of the writing from capture module 910 and analyze the representation to identify characters and symbols in the representation of the writing received from capture module 910. Compliance module 930 may receive the characters and symbols from handwriting recognition module 920 and apply grammar or language rules to assemble the individual characters and symbols into grammatical units such as words, phrases, clauses, sentences, paragraphs, mathematical terms, expressions, etc. Compliance module 930 may then apply one or more rules to the various grammatical units to determine whether a particular unit complies with, or violates, any of the one or more rules.

The compliance module 930 may output compliance data to a feedback module 940. Feedback module 940 may use the compliance data to determine whether and/or how to provide feedback to the user. For example, the feedback module 940 may examine stored user settings or configuration information to determine whether to provide feedback based on the received compliance data. Alternatively or additionally, the feedback module 940 may examine the users performance to determine whether to provide feedback. In other embodiments, whether and how the device provides feedback may depend on the particular educational program currently executing on the pen or external device. Alternatively, the feedback module 940 may always provide feedback.

The feedback module 940 may also use configuration information, user settings, or an algorithm to determine how or what type of feedback to provide. For example, the user may set the device to provide visual feedback, such as illuminating an LED. The user may alternatively or additionally set the device to provide audible feedback, such as playing a tone, and/or tactile feedback, such as vibration. Additionally, the user may configure the device to provide no feedback, or to provide feedback only when the user indicates a desire to receive feedback. For example, the user may push a button on the pen to indicate a desire for feedback. Alternatively, the device may detect that the user has performed a specified gesture, such as shaking or tapping the pen, to indicate that he or she desires feedback.

The feedback module 940 may additionally be configured to provide different types of feedback to enhance the educational value of the pen. For example, the pen may defer feedback depending on the type of problem and provide a verification mode that allows the user to check their work. In one example, the user writes out a multi-step math problem. At the end of the problem, the pen may illuminate a red LED to indicate that the solution written is incorrect. The pen may then automatically enter a verification mode, during which the user begins tracing over or re-working the problem from the beginning. The pen may illuminate a green LED to indicate compliance for each individual step of the problem, and then illuminate a yellow or red LED to indicate noncompliance. In another example, after misspelling the word "yellow" as "yelow", the pen may illuminate a red LED. After entering the verification mode, the pen may illuminate a green LED after the user writes each of the letters "y", "e", "l" and then a yellow or red LED when the user writes the letter "o" rather than a second "l". In this way the user is made aware that the "o" is incorrect. In another embodiment, the pen may register the position of the compliance data relative to the writing surface where the compliance data was generated. The pen may then produce positive or negative feedback as it the tip is moved into proximity of the various positions on the writing surface where compliance data was generated. The position data may be generated using an optical sensor and specially marked paper. In an alternate embodiment, the compliance data may be registered to positions in space as measured by one or more motion sensors or inertial navigation units.

The application 900 may also include a communication module 950 for communicating with external devices. For example, the communication module 950 may employ one or more standard communication protocols such as Wi-Fi, USB, or Bluetooth to allow the pen to communicate with various external devices such as wireless access points, laptop computers, desktop computers, printers, smartphones, headsets or earphones, etc. The communication module 950 may also enable the pen to communicate with external servers via the Internet. For example, the communication module 950 may enable access the Internet to allow the user to upload their performance information to an educational service provider. Additionally, the pen may access the Internet to automatically upload the stored representation of the user's writing to be archived on a server. The communication module 950 may also enable access to the Internet or other external devices to receive software updates, firmware updates, patches, upgrades, or new programs. Additionally, the communication module 950 may enable the pen to network with other pens. For example, the communication module 950 may allow user data, such as captured representations of the user's writings, compliance data, performance statistics, as well as profile information such as user ID and preferences, etc., to be transferred directly to another pen.

The application 900 may additionally include a storage module 960 for managing the storage of user data, such as captured representations of the user's writings, compliance data, performance statistics, profile information, and other information. The storage module 960 may work in conjunction with the communication module 950 to manually or automatically back up the stored information to an external device.

The application 900 may also include a rules module 970. The rules module may contain one or more rules used by the compliance module 930 or the feedback module 940 to generate compliance data and feedback. The rules maintained in the rules module 970 may be updated automatically or manually. For example, the rules may be updated when there is a software update or upgrade, when the user adds new software or changes the operational mode the pen, or when the pen syncs with an external device that has permission to update the rules maintained by the rules module 970. As an additional example, the rules may be updated by an algorithm that selectively updates the rules depending on the user's performance.

The application 900 may additionally include an input module 980. The input module 980 may receive, process, or respond to information received from the one or more input devices associated with the pen. For example, the input module 980 may receive audio information from the microphone and process the audio information using voice recognition software to determine whether the user has issued a command to which the input module 980 should respond. If, for example, the user spoke the words "stop feedback", the input module 980 may then communicate with the feedback module to stop generating feedback. Alternatively, the input module 980 may stop feedback by communicating with an output module 990 to disable one or more feedback or output devices. The input module 980 may also receive, process, or respond to information received from buttons and other sensors.

The application software may also include an output module 990. The output module may 990 control the various output devices of the pen. For example, in response to a communication from the feedback module, the output module 990 may generate an audio signal via a speaker in order to generate audio feedback. Additionally or alternatively, the output module 990 may cause an LED to illuminate, an electromechanical oscillator to vibrate, or a display on the pen to display a particular message to the user.

Although the application 900 has been described as including specific modules for performing specific tasks, this description is intended to be illustrative only. It is to be understood that any and all of the above-described functionalities may be carried out by more, fewer, or different software modules.

The pen may be configured to teach a wide variety of subjects useful at various stages of learning and intellectual development. For example, in one embodiment, the pen may be configured to identify and classify objects, pictures, or diagrams drawn with the pen. For example, if the user were to draw a picture of a flag followed by an "=" and then write the word flag, the pen may illuminate a green light or otherwise indicate positive feedback. Similarly, the pen could be configured to operate in a language translation mode. For example, in this mode, the user could specify an English/Spanish mode. Subsequently, if the user were to write "cat" followed by an "=" and the word "gato", the pen would provide positive feedback. Yet another example includes science. In this example, the pen could be configured to provide positive feedback after the user writes correct scientific relations or identities. For instance, if the user were to write a chemical formula, such as "$H_2O$" followed by an "=" and the name of the chemical, i.e., "water", the pen may illuminate a green LED. Yet another example includes history, wherein the pen may be configured to provide positive feedback after writing "#1president=George Washington" or "George Washington was the first president of the United States". In general, the pen may employ language processing algorithms to provide feedback indicating the veracity of any recognizable identity, equation, relation, statement, or formulation that can be verified against available databases. Portions or all of the language processing and database queries may be performed on one or more external devices in communication with the pen.

Additionally, a user may upload all of his or her captured writings to an external device. The writings may be indexed by date, time, location, and/or pen to facilitate search and retrieval of specific writings from multiple pens. The stored writing may also be text searchable.

The pen's ability to monitoring and report changes in a user's handwriting, spelling, grammar, and/or other skills over time and can be useful in numerous applications. By way of example, in one embodiment, the pen may be used to monitor a user's response to a therapy regimen. Changes in a person's writing can be an indicator of changes in executive function, motor function, and other physiological and/or psychological conditions. For example, increased difficulty forming letters while writing may be a sign of a decrease in executive function. Similarly, improvements in handwriting may indicate improved executive function. Accordingly, the disclosed pen may be used to provide enhanced feedback to a physician or therapist who is administering or otherwise monitoring a patient during a therapy regimen. The system may include a communication interface that receives a representation of a writing created by the patient when he or she moves the tip of the pen relative to a surface. The representation of the writing may be stored and then analyzed by a processor.

In one embodiment, the processor may first identify a series or sequence of symbols in the representation of the writing using an optical character recognition (OCR) algorithm. For example, the processor may identify characters using techniques such as matrix matching, feature extraction, and/or neural networks. The OCR algorithm may generate, for each character included in the representation of the writing, a list of candidate characters and corresponding confidence values for each candidate character. The processor may assign the candidate character with the highest confidence value to a series of identified characters. The processor may also store the confidence value for each of the identified characters, thereby producing a series of confidence values corresponding to the series of identified characters. In this embodiment, the confidence values may represent all or part of the compliance data described above.

The series of confidence values may be useful in measuring changes in the user's handwriting. Characters identified with lower confidence values may be indicative of handwriting or character formation that deviates more from handwriting conventions than characters identified with higher confidence values. Thus, by storing or otherwise monitoring the character-level confidence values from OCR algorithm for a particular user over time, changes in the user's handwriting can be detected. These changes in the user's handwriting may reveal changes in the user's medical condition that would not otherwise have been detected.

A human may have difficulty detecting changes in the OCR confidence values, especially if the changes are subtle, occur over a long period of time, or if the confidence values have a wide variance. To assist humans, such as doctors, caregivers, or the users themselves, in detecting such changes, the system may generate at least one performance metric by performing any of a number of statistical analysis on the series of confidence values. By way of example, the system may generate the at least one performance metric by computing one or more of the mean value, median value, or the variance of a series of confidence values. Additionally or alternatively, the at least one performance metric could be generated by computing a linear regression on a series of confidence values. These and/or other statistical representations of the OCR confidence values may assist people in detecting and/or measuring changes in the user's handwriting.

The performance metric alone may be sufficient to identify changes in the user's handwriting. For example, if the performance metric includes linear regression such as a best fit line with a negative slope, this may indicate handwriting that is getting worse over time. However, in another embodiment, the system may compute a baseline performance value to assist in detecting changes in the user's handwriting at a specific time, or during a specific period of time. For example, in order to measure the patient's response to a new medication, it may be useful to compute performance metrics on the patients handwriting before the patient begins (and/or after the patient stops) taking the medication, which may form part of a baseline performance metric. In this example, the patient's baseline performance metric may be compared to performance metrics computed while the patient is taking the new medication in order to detect a change. In general, an efficacy value for a therapy regimen may be computed based on the baseline performance metric and the performance metric taken during the therapy regimen.

In general, the use of OCR confidence values as compliance data described above can be combined or replaced with other types of compliance data and fed into statistical formulae in order to measure changes in the user's performance over time.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

I claim:

1. A writing device comprising:
a handheld housing;
a tip coupled to the housing and capable of writing on a surface;
a sensor coupled to the housing and configured to capture a representation of the writing;
a processor coupled to the housing and the sensor, the processor configured to:
identify a sequence of symbols including at least one word and at least one picture by performing handwriting recognition on the representation of the writing;
identify an expression contained in the identified sequence of symbols;
determine whether the expression containing the at least one word and at least one picture is true;
generate compliance data indicative of whether the expression is true; and
compute at least one score based on the compliance data;
a memory coupled to the housing and the processor, the memory device configured to store the representation of the writing, the sequence of symbols, the compliance data, and the at least one score;
an output device coupled to the housing and the processor, the output device generates real-time feedback based on the compliance data, wherein the feedback alerts the user when the at least one expression is true; and
a communication device coupled to the housing and the processor, the communication device configured to transmit the at least one score to a server configured to transmit the at least one score to a remote device.

2. A writing device comprising:
a handheld housing;
a tip coupled to the housing and capable of writing on a surface;
a sensor coupled to the housing and configured to capture a representation of the writing;
a processor coupled to the housing and the sensor, the processor configured to:
identify a sequence of symbols including at least one chemical symbol by performing handwriting recognition on the representation of the writing;
identify an expression contained in the identified sequence of symbols;
determine whether the expression containing the chemical symbol is true;
generate compliance data indicative of whether the expression is true; and
compute at least one score based on the compliance data;
a memory coupled to the housing and the processor, the memory device configured to store the representation of the writing, the sequence of symbols, the compliance data, and the at least one score;
an output device coupled to the housing and the processor, the output device generates real-time feedback based on the compliance data, wherein the feedback alerts the user when the at least one expression is true; and
a communication device coupled to the housing and the processor, the communication device configured to transmit the at least one score to a server configured to transmit the at least one score to a remote device.

3. A writing device comprising:
a handheld housing;
a tip coupled to the housing and capable of writing on a surface;
a sensor coupled to the housing and configured to capture a representation of the writing;
a processor coupled to the housing and the sensor, the processor configured to:
identify a sequence of symbols by performing handwriting recognition on the representation of the writing;
identify a plurality of words contained in the identified sequence of symbols;
identify a statement of historical fact contained in the identified plurality of words;
determine whether the statement of historical fact contained in the writing is true;

generate compliance data indicative of whether the expression is true; and compute at least one score based on the compliance data;

a memory coupled to the housing and the processor, the memory device configured to store the representation of the writing, the sequence of symbols, the compliance data, and the at least one score;

an output device coupled to the housing and the processor, the output device generates real-time feedback based on the compliance data, wherein the feedback alerts the user when the statement is true; and a communication device coupled to the housing and the processor, the communication device configured to transmit the at least one score to a server configured to transmit the at least one score to a remote device.

* * * * *